United States Patent [19]
Forse et al.

[11] Patent Number: 5,805,037
[45] Date of Patent: Sep. 8, 1998

[54] DISTRIBUTED TRANSMISSION LINE STRUCTURE

[75] Inventors: Roger J. Forse, Wauconda; William L. Olson, Lake Villa, both of Ill.

[73] Assignee: Motorola Corporation, Schaumburg, Ill.

[21] Appl. No.: 780,020

[22] Filed: Dec. 23, 1996

[51] Int. Cl.$^6$ ............................................. H01P 3/08
[52] U.S. Cl. ............................................. 333/238
[58] Field of Search .................... 333/286, 238, 333/116

[56] References Cited

U.S. PATENT DOCUMENTS

| | | | |
|---|---|---|---|
| 3,093,805 | 6/1963 | Osifchin et al. | 333/238 X |
| 3,512,110 | 5/1970 | Clar | 333/116 |
| 4,110,712 | 8/1978 | Morris | 333/238 X |
| 5,446,425 | 8/1995 | Banba | 333/238 X |
| 5,576,669 | 11/1996 | Ruelke | 333/238 X |
| 5,594,393 | 1/1997 | Bischof | 333/238 X |

*Primary Examiner*—Paul Gensler
*Attorney, Agent, or Firm*—Douglas D. Fekete; John B. MacIntyre

[57] ABSTRACT

A distributed transmission line structure (10) includes a ground plane (26) affixed to a substrate (12). The substrate (12) is formed of a generally nonconductive material. A first metallic strip (14) is affixed to the substrate (12) and is electrically connected to the ground plane (26) through a first through-hole (34). A second metallic strip (16) is affixed to the substrate (12) and is spaced apart from the first metallic strip (14) by a gap (28) and is electrically connected to the ground plane (26) through a second through-hole (38). A dielectric layer (20) overlies the substrate (12), the first metallic strip (14), and the second metallic strip (16). A third metallic strip (18) is affixed to the dielectric layer (20) and is disposed to overlie the gap (28). The third metallic strip (18) has a width less than the gap (28). The impedance of the distributed transmission line structure (10) is substantially constant over a predetermined range of thickness of the dielectric layer (20).

17 Claims, 1 Drawing Sheet

5,805,037

DISTRIBUTED TRANSMISSION LINE STRUCTURE

FIELD OF THE INVENTION

This invention relates generally to a distributed transmission line structure. More particularly, this invention relates to such a structure wherein first and second metallic strips are spaced apart by a gap, and a third metallic strip is spaced apart from the first and the second metallic strips by a dielectric layer and overlies the gap.

BACKGROUND OF THE INVENTION

It is known to transmit electrical signals over electrical traces, sometimes referred to as transmission lines, in electronic devices, such as transmitters. The devices typically include a ground plane and a dielectric material disposed between the ground plane and the transmission line. The dielectric material is characterized by a dielectric constant.

The impedance of the device is determined by the width of the transmission line, the thickness of the dielectric material, and the dielectric constant of the dielectric material. In most electronic devices today, each of these three factors, width, thickness, and dielectric constant, are manufacturable to within a reasonable tolerance level. Consequently, the impedance can be controlled within acceptable ranges.

As devices have become smaller and more lightweight, the thickness of the dielectric material has decreased. Consequently, variances in the thickness are magnified when determining line impedance. Therefore, tighter tolerances are required. It has been difficult to obtain consistent dielectric thicknesses at these thicknesses, typically in the one to two mil range. This is particularly true when comparing different batches of the dielectric material. This has led to a difficulty in achieving adequately reliable transmission line structures, since the thickness difference, which may only be in the ten to fifteen micron range, is still large in proportion to the overall thickness of the dielectric.

Consequently, a need exists for a distributed transmission line structure that is capable of providing a substantially constant impedance over an extended variance in the dielectric thickness.

BRIEF SUMMARY OF THE INVENTION

This invention provides a distributed transmission line structure that includes a substrate having opposite first and second surfaces The substrate is formed of a generally nonconductive material. A ground plane is affixed to the second surface of the substrate. A first metallic strip is affixed to the first surface of the substrate and is adapted for electrical connection to the ground plane, such as through a plated through-hole through the substrate and electrically connected to the ground plane. A second metallic strip is affixed to the first surface of the substrate and is spaced apart from the first metallic strip by a gap. The second metallic strip is adapted for electrical connection to the ground plane, by way of a plated through-hole or the like. A dielectric layer overlies the substrate and the first and second metallic strips. A third metallic strip is affixed to the dielectric layer and is disposed to overlie the gap. The third metallic strip preferably has a width less than the gap and is adapted to transmit an electrical signal. A distributed transmission line structure is thus formed.

Detailed Description of a Preferred Embodiment

Figure 1:
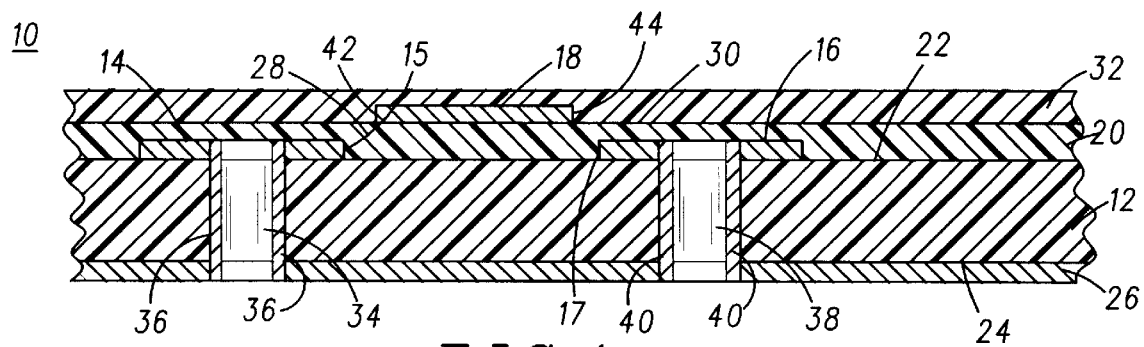
FIG. 1 is a cross-sectional view of a distributed transmission line structure comprising a first and second metallic strip spaced apart from a third metallic strip by a dielectric material in accordance with a preferred embodiment of the invention.
Figure 2:
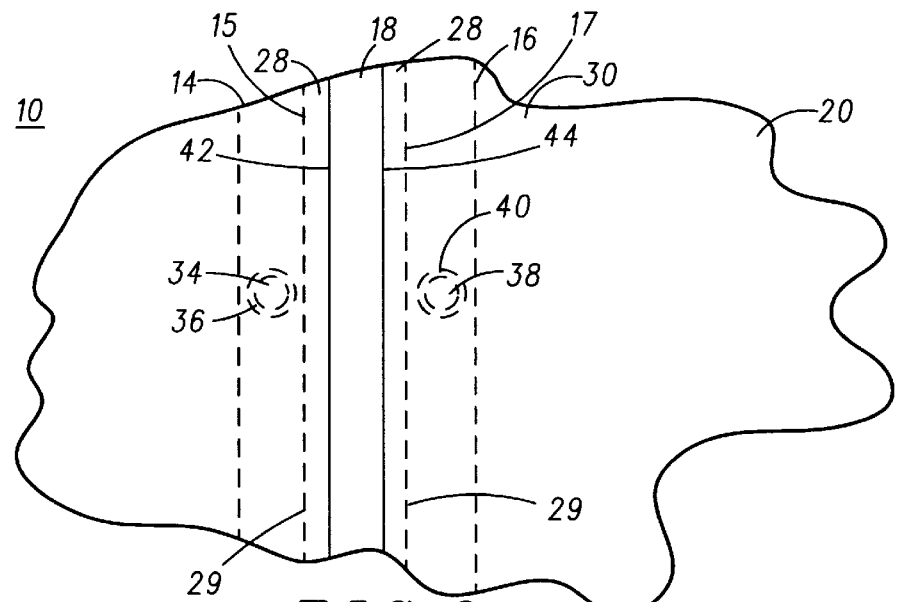
FIG. 2 is a top plan view of the distributed transmission line structure in FIG. 1.
Figure 3:
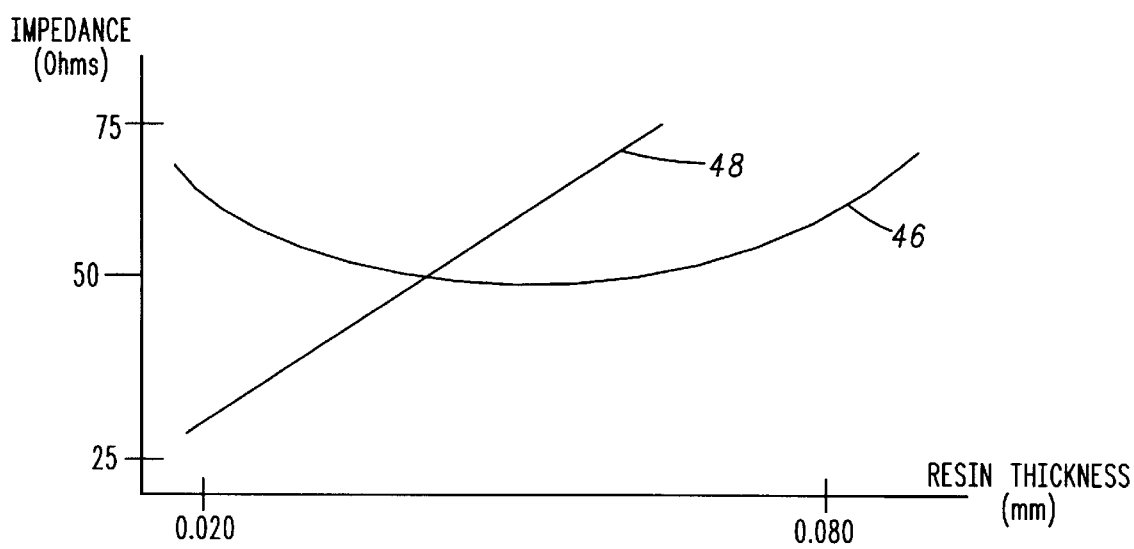
FIG. 3 is a graph of impedance plotted against resin thickness in accordance with the preferred embodiment.

The invention can be better understood with reference to FIGS. 1–3. In accordance with a preferred embodiment of this invention, FIGS. 1 and 2 depict a distributed transmission line structure 10. Distributed transmission line structure 10 includes a substrate 12 formed of a generally nonconductive material, such as a polymer layer laminated onto a ceramic or polymer/glass mesh core, commonly referred to as an FR4 board. Substrate 12 includes a first surface 22 and a second surface 24 opposite first surface 22. In a preferred embodiment, surfaces 22 and 24 are substantially planar.

A ground plane 26 is affixed to substrate 12 at second surface 24. Ground plane 26 is suitable to act as ground for distributed transmission line structure 10. Ground plane 26 is preferably formed of copper and is formed by rolling, stamping, plating, or other suitable methods and has a thickness of about at least 10microns.

A first metallic strip 14 and a second metallic strip 16 are affixed to first surface 22 of substrate 12. Strips 14 and 16 are preferably formed by plating or etching copper onto first surface 22. Strips 14 and 16 preferably have a width of about 200 microns and a thickness of between about 15 and 20 microns. First metallic strip 14 includes a first inner edge 15. Second metallic strip 16 includes a second inner edge 17. Gap 28 is defined between edges 15 and 17 and includes boundaries 29 that extend essentially perpendicular to substrate 12. Gap 28 has a width along first surface 22 that is substantially constant over the lengths of strips 14 and 16. In this manner, strips 14 and 16 are coplanar and parallel.

First metallic strip 14 and second metallic strip 16 are adapted for connection to ground plane 26. In a preferred embodiment, a through-hole 34 is formed by drilling through first metallic strip 14, substrate 12, and ground plane 26. Through-hole 34 is then plated, with copper or the like, to form through-hole plating 36 that electrically connects first metallic strip 14 with ground plane 26. A second through-hole 38 is formed by drilling through second metallic strip 16, substrate 12, and ground plane 26, and then plating, with copper or the like, second through-hole 38 with second through-hole plating 40. Strips 14 and 16 can also be connected to ground plane 26 with vias filled with a conductive material, commonly referred to as blind vias.

A dielectric layer 20 is formed to overlie substrate 12, first metallic strip 14, and second metallic strip 16. Dielectric layer 20 includes a dielectric layer surface 30 opposite first surface 22. Dielectric layer 20 is preferably formed by depositing a partially cured prepolymer onto substrate 12. The prepolymer is preferably an epoxy resin that includes photodefinable material dispersed within the polymeric matrix. The epoxy prepolymer is photodefined to define traces, which are then developed.

The prepolymer is then cured and soaked in a metallizing bath to metallize the traces to form third metallization layer 18. In a preferred embodiment, third metallization layer 18 lies within boundaries 29 of gap 28 such that layer 18 does not overly first metallic strip 14 or second metallic strip 16. Dielectric layer 20 may also be formed by curtain coating substrate 12, first metallic strip 14, and second metallic strip 16 with a liquid prepolymer and subsequently curing the prepolymer to form layer 20. Dielectric layer 20 preferably has a thickness between about 25 and 75 microns.

In a preferred embodiment, a solder mask 32 is positioned over dielectric layer 20 and third metallic strip 18. Solder mask 32 covers third metallic strip 18, thereby protecting strip 18 from oxidation and other potential environmental damage.

Two types of capacitance, direct capacitance and fringe capacitance, are formed in dielectric layer 20 when third metallic strip 18 carries a signal. Direct capacitance is formed between third metallic strip 18 and ground plane 26. Fringe capacitance is formed between first edge 42 and first metallic strip 14, and also between second edge 44 and second metallic strip 16. When the thickness of dielectric layer 20 is relatively small, such as about 25 microns, the direct capacitance is relatively high and the fringe capacitance is relatively low. As the thickness of dielectric layer 20 increases to about 75 microns, the direct capacitance decreases and the fringe capacitance increases. Consequently, the total capacitance, the sum of the direct capacitance and the fringe capacitance, typically varies depending upon the thickness of the dielectric layer.

Using the present invention, the fringe capacitance and the direct capacitance are balanced such that as the direct capacitance decreases, the fringe capacitance increases by approximately the same amount. In this manner, the total capacitance is substantially equal over a predetermined range of thicknesses. In a preferred embodiment, the thickness of the dielectric layer varies between about 25 and 75 microns. The strip width of third metallic strip 18 is preferably less than the width of gap 28, and in a preferred embodiment the ratio of the strip width to the gap width is about 4:5.4. In a preferred embodiment, the strip width of third metallic strip 18 is about 200 microns, and the gap width of gap 28 is about 270 microns. A distributed transmission line structure is thus formed wherein the impedance of the structure is relatively constant over a predetermined thickness of the dielectric layer. In this manner, reliable transmission line structures are formed, even when the thickness of the dielectric layer varies within the predetermined range.

FIG. 3 depicts the impedance of the distributed transmission line structure plotted against the thickness of the dielectric layer. Curve 46 represents the impedance of the present invention. As can be seen, the impedance is substantially constant over the desired dielectric thickness, between about 25 and 75 microns. Curve 48 represents the prior art structures. As can be seen, the impedance varies greatly over the range of dielectric thickness. Consequently, reliable structures were difficult to manufacture based on the huge variance of impedance based upon the thickness of the dielectric layer. The present invention balances the direct and fringe capacitance across the thickness of material that is used in high density interconnect structures such that, over a predetermined range of thicknesses, the total capacitance is substantially constant. The desired impedance is selected to be near the perigee, or minimum point, of the curve. In this manner, over a predetermined range of dielectric thickness, such as between about 25 and 75 microns, the impedance is relatively constant and within an acceptable range such that a reliable distributed transmission line structure is formed.

Thus, the present invention provides a distributed transmission line structure that has a relatively constant impedance over a predetermined range of thicknesses of the dielectric layer. Deleterious effects caused by variances of the dielectric layer, as are common between substrates formed by different vendors and even between substrates produced by a single vendor, are minimized by maintaining a relatively constant impedance over a predetermined thickness of the dielectric layer. This predetermined thickness range is within commercially available specifications and can be achieved reliably, thereby allowing the structures formed to be reliable.

Although the present invention has been described with three metallic strips, the structure may include any number of metallic strips in which the sum of the direct and fringe capacitance are substantially equal over a predetermined range of thickness of the dielectric material. Further, the third metallic strip that carries the signal can be formed on a layer overlying the ground plane, and the first and second metallic strips may be formed on further layers spaced apart from the ground plane and connected to the ground plane through vias, such as through-holes or filled vias. Still further, the present invention can be embodied in a structure comprising first and second metallic strips separated by a dielectric layer, wherein the direct capacitance and the fringe capacitance is balanced over a predetermined thickness of the dielectric layer.

While this invention has been described in terms of certain examples thereof, it is not intended that it be limited to the above description, but rather only to the extent set forth in the claims that follow.

The embodiments of this invention in which an exclusive property or privilege is claimed are defined as follows:

We claim:

1. A distributed transmission line structure comprising:
   a substrate formed of a generally nonconductive material and including a first surface and a second surface;
   a ground plane affixed to the substrate at the second surface;
   a first metallic strip overlying the first surface of the substrate and electrically connected to the ground plane, said first metallic strip comprising a first inner edge;
   a second metallic strip overlying the first surface of the substrate and electrically connected to the ground plane, said second metallic strip comprising a second inner edge that is spaced apart from the first inner edge by a gap such that boundaries of the gap extend essentially perpendicular to the substrate from the first inner edge and the second inner edge, the first metallic strip and the second metallic strip defining a common plane; and
   a third metallic strip overlying the substrate such that the third metallic strip is within the boundaries of the gap, the third metallic strip being spaced apart from the common plane.

2. A distributed transmission line structure in accordance with claim 1, further comprising a dielectric layer within the common plane and separating the first metallic strip from the second metallic strip and wherein the third metallic strip is disposed adjacent to the dielectric layer.

3. A distributed transmission line structure in accordance with claim 2, further comprising a dielectric layer formed between the first inner edge of the first metallic strip and the third metallic strip.

4. A distributed transmission line structure in accordance with claim 1, wherein the third metallic strip is characterized by a strip width, and wherein the gap is characterized by a gap width, and wherein the ratio of the strip width to the gap width is about 4:5.4.

5. A distributed transmission line structure in accordance with claim 1, further comprising a first through-hole plated with a conductive first through-hole plating and electrically connecting the first metallic strip with the ground plane.

6. A distributed transmission line structure in accordance with claim 1, wherein the substrate defines a first via, and wherein the first via is filled with a conductive material to electrically connect the first via with the ground plane.

7. A distributed transmission line structure in accordance with claim 5, further comprising a second through-hole plated with a conductive second through-hole plating and electrically connecting the second metallic strip with the ground plane.

8. A distributed transmission line structure in accordance with claim 6, wherein the substrate defines a second via, and wherein the second via is filled with a conductive material to electrically connect the second via with the ground plane.

9. A distributed transmission line structure comprising:
   a substrate formed of a generally nonconductive material and including a first surface and a second surface;
   a ground plane affixed to the substrate at the second surface;
   a first metallic strip affixed to the first surface of the substrate and electrically connected to the ground plane, the first metallic strip having a first inner edge;
   a second metallic strip affixed to the first surface of the substrate, said second metallic strip having a second inner edge being spaced apart from the first metallic strip by a gap having boundaries defined by the first inner edge and the second inner edge, the second metallic strip electrically connected to the ground plane;
   a dielectric layer overlying the substrate, the first metallic strip, and the second metallic strip, said dielectric layer including a dielectric layer surface; and
   a third metallic strip affixed to the dielectric layer surface and disposed to overlie the gap within the boundaries, said third metallic strip adapted to transmit an electrical signal.

10. A distributed transmission line structure in accordance with claim 9, wherein the dielectric layer has a thickness between about 25 and 75 microns.

11. A distributed transmission line structure in accordance with claim 9, further comprising a solder mask overlying the dielectric layer and the third metallic strip.

12. A distributed transmission line structure in accordance with claim 9, wherein the third metallic strip is characterized by a strip width, and wherein the gap is characterized by a gap width, and wherein the strip width is less than the gap width.

13. A distributed transmission line structure in accordance with claim 12, wherein the ratio of the strip width to the gap width is about 4:5.4.

14. A distributed transmission line structure in accordance with claim 9, further comprising a first through-hole plated with a conductive first through-hole plating and electrically connecting the first metallic strip with the ground plane.

15. A distributed transmission line structure in accordance with claim 9, wherein the substrate defines a first via, and wherein the first via is filled with a conductive material to electrically connect the first via with the ground plane.

16. A distributed transmission line structure in accordance with claim 14, further comprising a second through-hole plated with a conductive second through-hole plating and electrically connecting the second metallic strip with the ground plane.

17. A distributed transmission line structure in accordance with claim 15, wherein the substrate defines a second via, and wherein the second via is filled with a conductive material to electrically connect the second via with the ground plane.

* * * * *